(12) United States Patent
Tang et al.

(10) Patent No.: US 8,278,689 B1
(45) Date of Patent: Oct. 2, 2012

(54) MEMORY AND INTERCONNECT DESIGN IN FINE PITCH

(75) Inventors: Qiang Tang, Cupertino, CA (US); Min She, Fremont, CA (US); Ken Liao, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/236,312

(22) Filed: Sep. 19, 2011
(Under 37 CFR 1.47)

Related U.S. Application Data

(63) Continuation of application No. 12/328,369, filed on Dec. 4, 2008, now Pat. No. 8,022,443.

(60) Provisional application No. 60/992,902, filed on Dec. 6, 2007.

(51) Int. Cl.
*H01L 23/52* (2006.01)

(52) U.S. Cl. ........ 257/211; 257/206; 257/202; 257/208; 257/210; 257/234; 257/754; 257/209; 257/512; 257/E27.105; 257/E51.008

(58) Field of Classification Search .............. 257/211, 257/206, 202, 208, 210, 234, 225, 209, E27.105, 257/E51.008
See application file for complete search history.

(56) References Cited

U.S. PATENT DOCUMENTS 6,166,403 A * 12/2000 Castagnetti et al. .......... 257/211
2005/0224982 A1* 10/2005 Kemerling et al. .......... 257/758

* cited by examiner

*Primary Examiner* — Marc Armand

(57) ABSTRACT

A memory array including a diffusion layer, a poly layer, a metal one layer, a metal two layer, and a contact. The diffusion layer comprises diffusion lines extending in a first direction. The poly layer comprises poly lines extending in the first direction and being arranged on top of and insulated from the diffusion layer. The metal one layer comprises metal one lines extending in the first direction and being arranged on top of and insulated from the poly layer. The metal two layer comprises a metal two line extending in the first direction and being arranged on top of and insulated from the metal one layer. The contact extends through the poly layer, and connects a metal one line to a diffusion line. A poly line further extends in a second direction to bend around the contact such that a predetermined distance separates the poly lines from the contact.

10 Claims, 13 Drawing Sheets

MEMORY AND INTERCONNECT DESIGN IN FINE PITCH

CROSS-REFERENCE TO RELATED APPLICATIONS

This present disclosure is a continuation of U.S. application Ser. No. 12/328,369, filed on Dec. 4, 2008, which claims priority under 35 U.S.C. §119(e) to U.S. Provisional Application No. 60/992,902 filed on Dec. 6, 2007.

FIELD

The disclosure relates to integrated circuits, and more particularly to integrated circuits for memory arrays.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In a conventional integrated circuit, a substrate is typically covered with a number of layers of conductive or other material, which are patterned to form a plurality of signal lines that determine the circuit layout. Interconnections between the signal lines may be formed, e.g., by vias or contacts, that run between or through the various layers. The term "contact" will be used throughout this disclosure as a generic term encompassing any electrical interconnections between signal lines, specifically including, but not limited to, contacts between metal and poly lines and vias between two metal lines. In some memory arrays, these signal lines run perpendicular to each other.

FIGS. 1A and 1B illustrate a prior art memory array 40 having parallel signal lines. As shown in FIG. 1A, the memory array 40 includes a substrate 45 having a plurality of diffusion lines 46-1 to 46-4. A plurality of poly lines 47-1 to 47-3 and metal lines 48-1 to 48-4 are layered on top of substrate 45, and are parallel to diffusion lines 46. Referring to FIG. 1B, memory array 40 is constructed by layering poly lines 47 over substrate 45, including diffusion lines 46, and then layering the metal lines 48 to reside on top of the poly layer. Each of these layers is respectively separated from one another by an insulating barrier layer 44-1 to 44-3. Metal lines 48-1 to 48-4 are connected to diffusion lines 46-1 to 46-4 by means of contacts 49. These contacts 49 must run from the metal line layer to the diffusion layer and, thus, travel through the layer that contains poly lines 47-1 to 47-3 (see FIG. 1B). In this configuration, the pitch of the signal lines cannot be at a minimum feature because of the possibility that contacts 49 will "touch" or contact with poly lines 47, as described below.

In FIG. 1B, the proximity between contacts 49 and poly lines 47 at locations 490-1 to 490-6 leads to an unacceptable risk of short circuit. If the width of the signal lines is at minimum feature, the contacts 49 may be immediately adjacent to poly lines 47. Thus, a circuit designer may choose to make the width of the signal lines wider than the pitch of contacts 49. In the prior art integrated circuit layout of FIG. 1B, an integrated circuit manufacturer may provide extra spacing (or a buffer) between poly lines 47 and contacts 49 at locations 490-1 to 490-6 to reduce the possibility of interconnection between poly lines 47 and contacts 49. The addition of these buffer areas requires the utilization of more surface area on the substrate 45. In this manner, a circuit designer may reduce the potential for contact/poly lines interconnection, but only at the cost of utilizing a larger surface area on the substrate 45.

SUMMARY

In some embodiments of the present disclosure, an integrated circuit is disclosed. The integrated circuit comprises: a first signal line layer comprising a plurality of first signal lines, wherein the plurality of first signal lines extend in a first direction; a second signal line layer comprising a plurality of second signal lines, wherein the plurality of second signal lines extend in the first direction and are arranged on top of and insulated from the first signal line layer; a third signal line layer comprising a plurality of third signal lines, wherein the plurality of third signal lines extend in the first direction and are arranged on top of and insulated from the second signal line layer; and a contact that extends through the second signal line layer, wherein the contact connects at least one of the plurality of third signal lines to at least one of the plurality of first signal lines, wherein at least one of the plurality of second signal lines further extends in a second direction to bend around the contact such that at least a predetermined distance separates the plurality of second signal lines from the contact.

In some embodiments, the predetermined distance comprises a minimum feature size of the integrated circuit.

In some embodiments, the integrated circuit further comprises a fourth signal line layer comprising at least one fourth signal line, wherein the at least one fourth signal line extends in the first direction and is arranged on top of and insulated from the third signal line layer, and wherein the at least one fourth signal line is connected to at least one of the plurality of second signal lines.

In some embodiments, the second direction is substantially perpendicular to the first direction.

In some embodiments, the integrated circuit comprises a memory array.

In some embodiments of the present disclosure, a method of manufacturing an integrated circuit is disclosed. The method comprises: forming a first signal line layer comprising a plurality of first signal lines, wherein the plurality of first signal lines extend in a first direction; forming a second signal line layer comprising a plurality of second signal lines, wherein the plurality of second signal lines extend in the first direction and are arranged on top of and insulated from the first signal line layer; forming a third signal line layer comprising a plurality of third signal lines, wherein the plurality of third signal lines extend in the first direction and are arranged on top of and insulated from the second signal line layer; and connecting at least one of the plurality of third signal lines to at least one of the plurality of first signal lines with a contact that extends through the second signal line layer, wherein at least one of the plurality of second signal lines further extends in a second direction to bend around the contact such that at least a predetermined distance separates the plurality of second signal lines from the contact.

In some embodiments of the method, the predetermined distance comprises a minimum feature size of the integrated circuit.

In some embodiments, the method further comprises forming a fourth signal line layer comprising at least one fourth signal line, wherein the at least one fourth signal line extends in the first direction and is arranged on top of and insulated from the third signal line layer, and wherein the at least one fourth signal line is connected to at least one of the plurality of second signal lines.

In some embodiments of the method, the second direction is substantially perpendicular to the first direction.

In some embodiments of the method, the integrated circuit comprises a memory array.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1A:
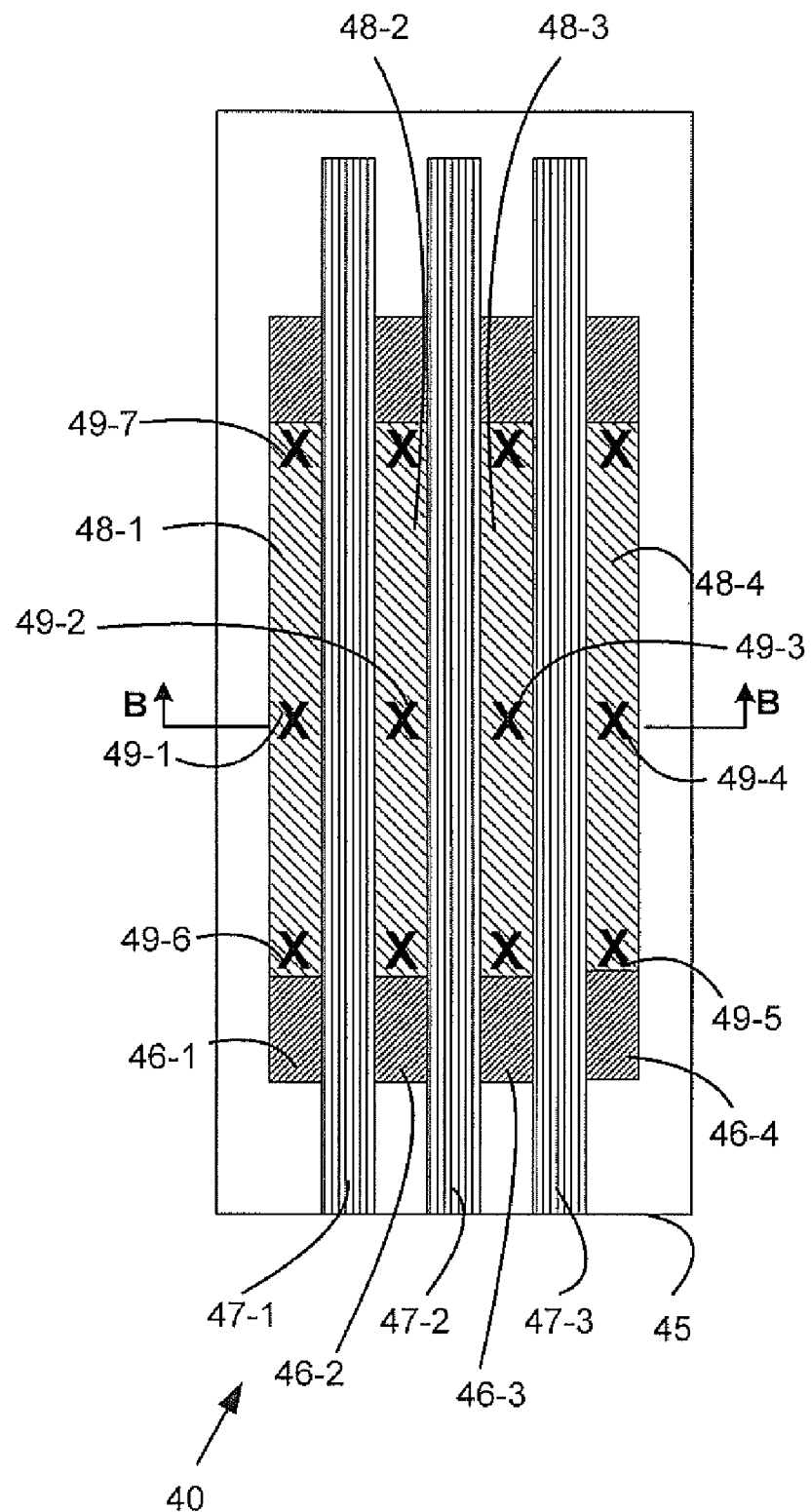
FIG. 1A is a plan view showing a memory array according to the prior art.
Figure 1B:
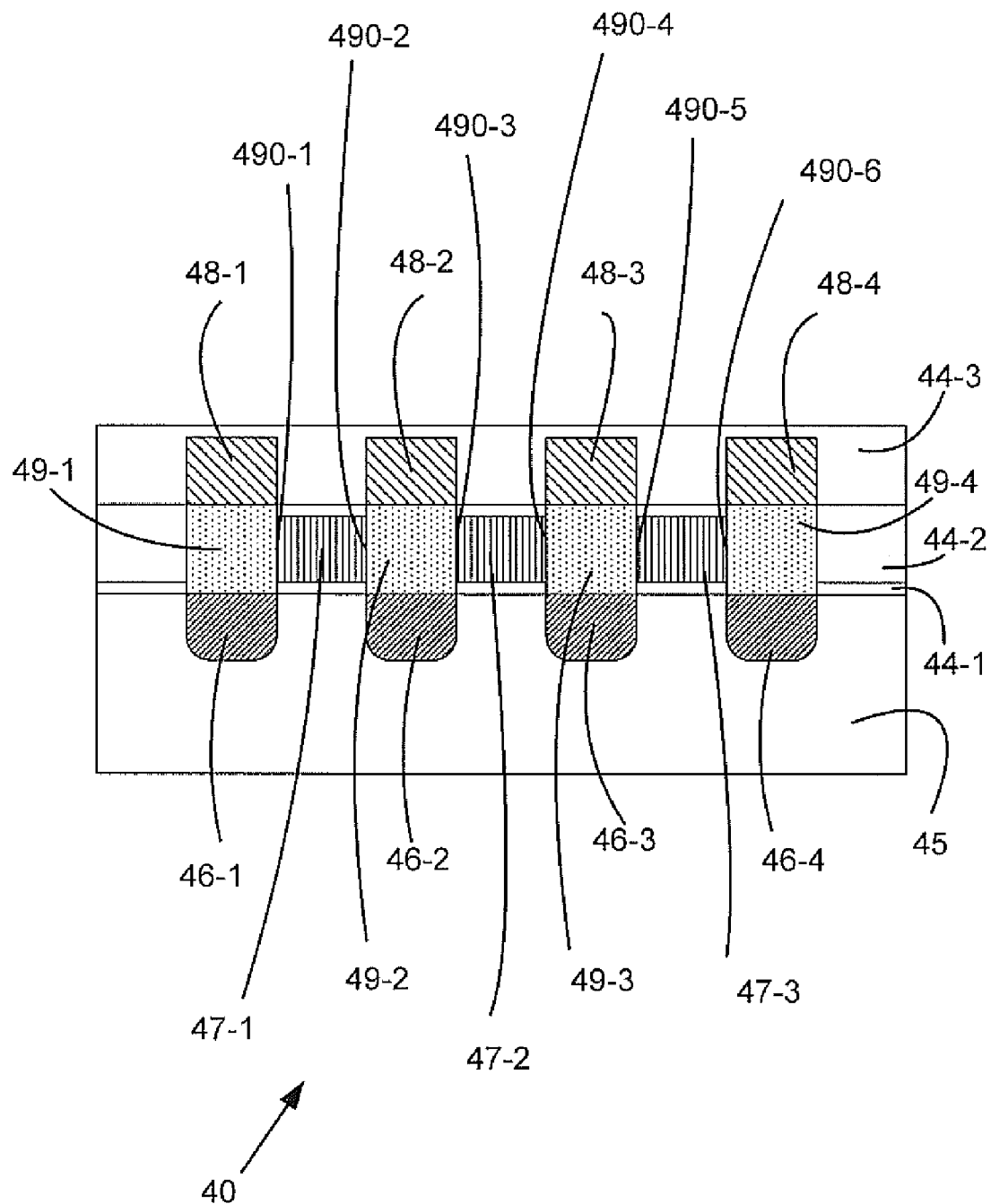
FIG. 1B is a cross-sectional view along the line B-B of the memory array of FIG. 1A.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 2A:
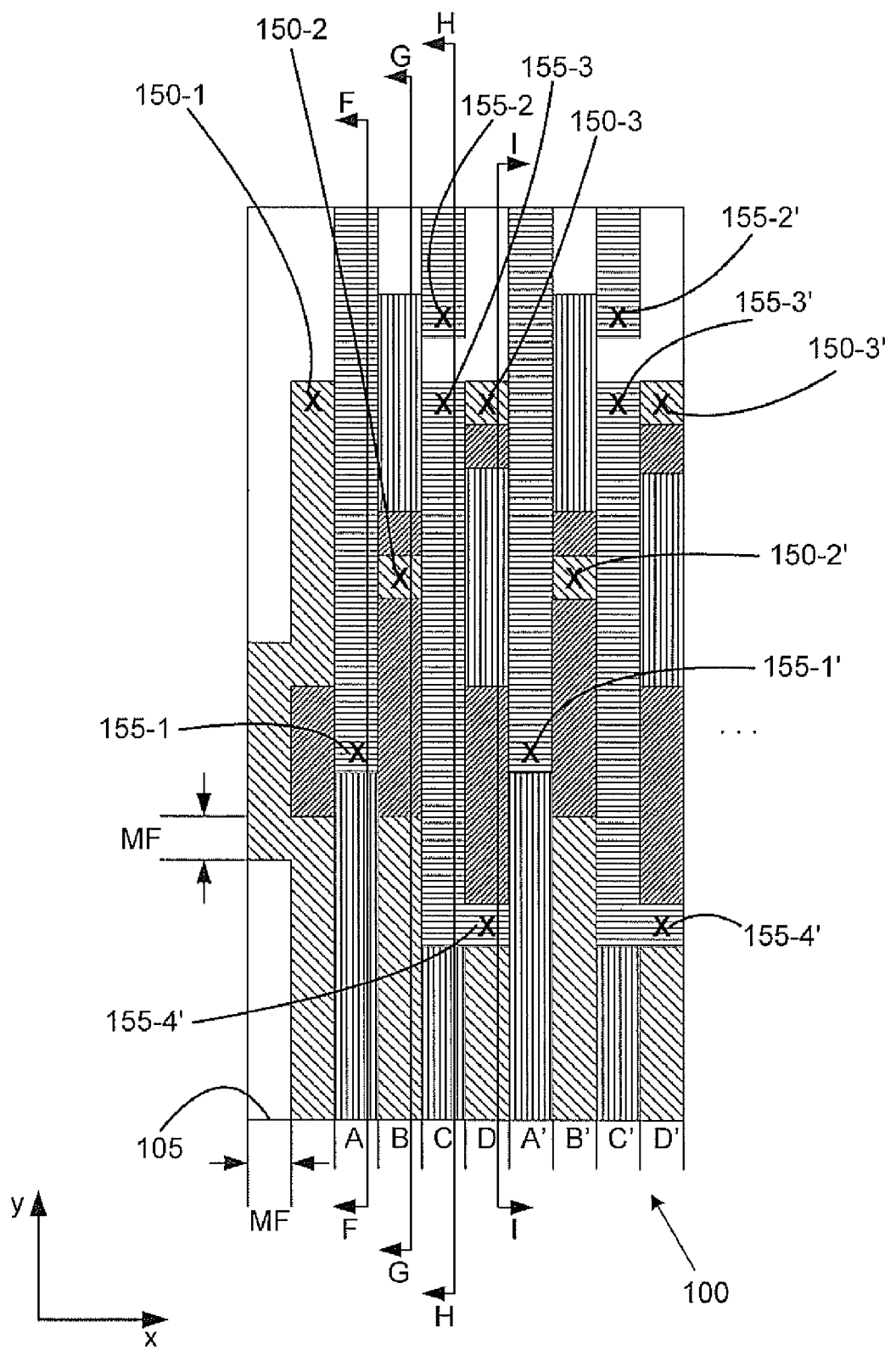
FIG. 2A is a plan view of a memory array according to some embodiments of the present disclosure.
Figure 2B:
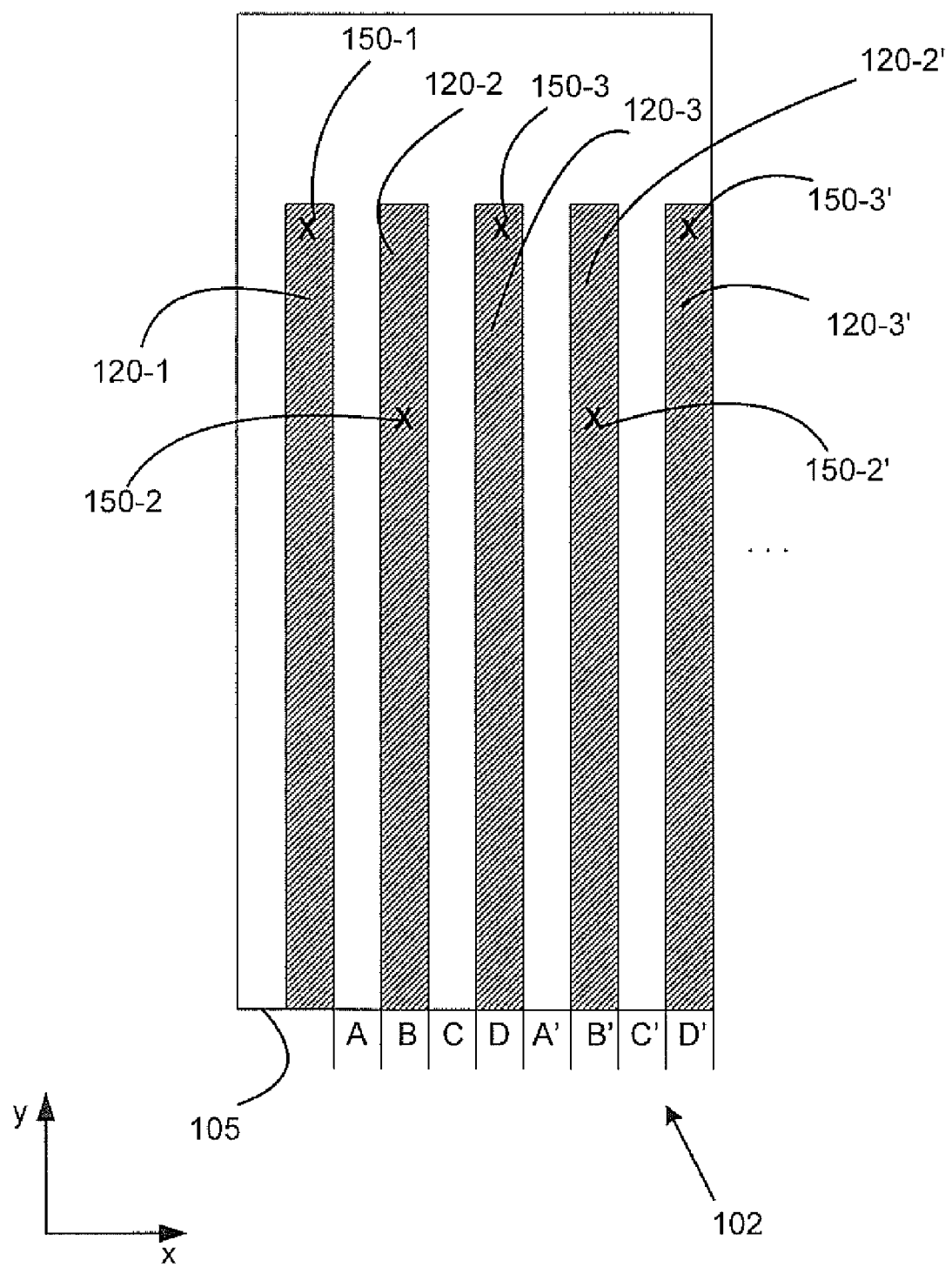
FIG. 2B is a plan view of a diffusion layer of the memory array of FIG. 2A.

Referring now to FIG. 2A, a memory array 100 according to some embodiments of the present invention is illustrated. Memory array 100 comprises four separate layers on a substrate 105, although the present disclosure could be implemented with a different number of layers. These layers comprise diffusion layer 102, poly layer 104, metal one layer 106 and metal two layer 108, which are illustrated in FIGS. 2B, 2C, 2D and 2E, respectively. Diffusion layer 102 comprises a plurality of diffusion lines 120-1 to 120-3 and 120-2' to 120-3'. These diffusion lines 120 may be constructed by diffusing various impurities into substrate 105. Furthermore, as illustrated in FIG. 2A, diffusion lines 120 may be connected to metal one layer 106 by a plurality of contacts 150-1 to 150-3 and 150-2' to 150-3'. One of the differences between the prior art memory arrays described above and memory array 100 is the addition of the metal two layer 108, which is utilized as described below.

Figure 2C:
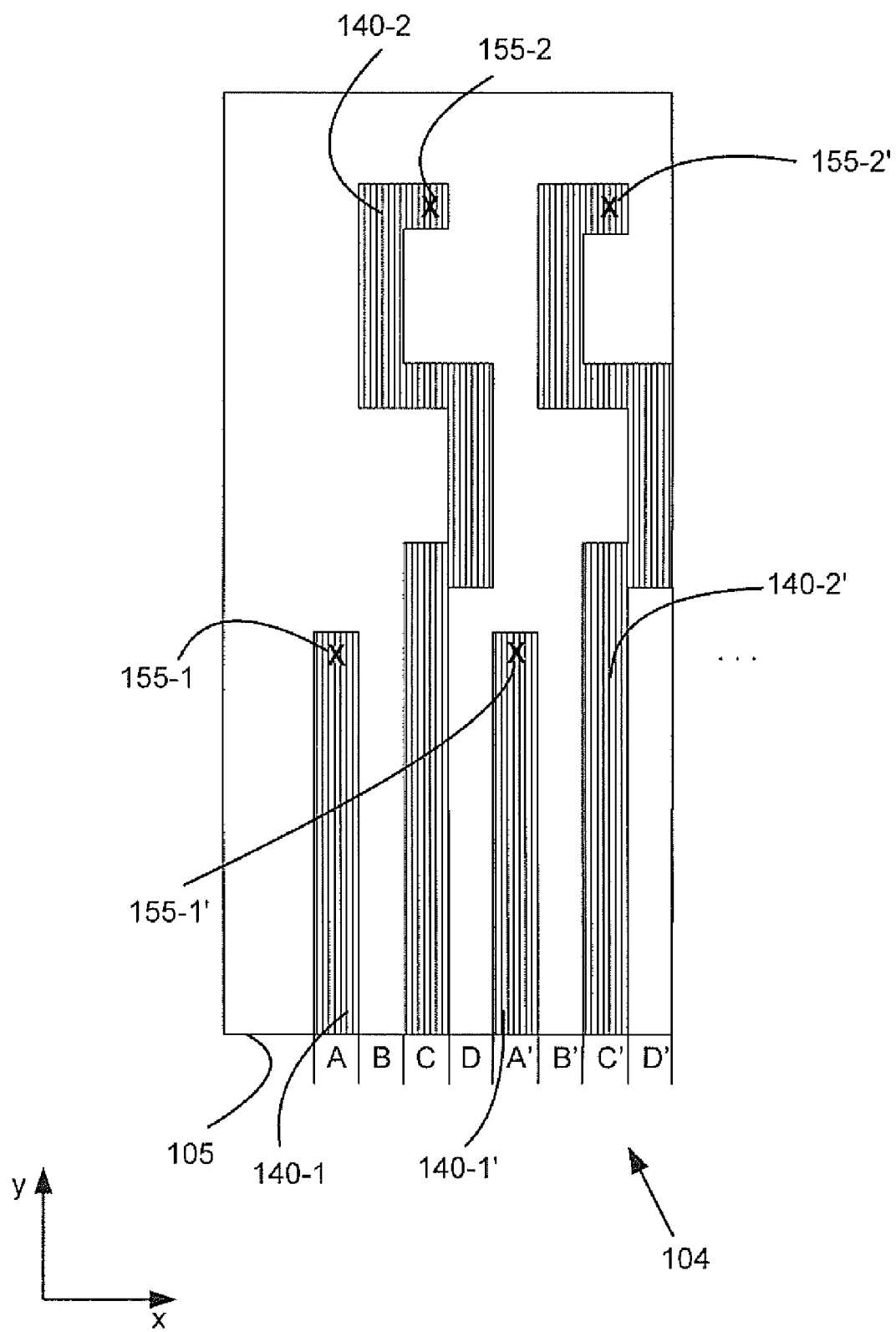
FIG. 2C is a plan view of a poly layer of the memory array of FIG. 2A.

Memory array 100 is constructed by placing poly layer 104 over the substrate 105 with diffusion layer 102. As illustrated, for example, in FIG. 2C, poly layer 104 comprises a plurality of poly signal lines 140-1 to 140-2 and 140-1' to 140-2'. In contrast to the poly lines of prior art memory arrays, poly lines 140-1, 140-2, 140-1' and 140-2' do not extend solely in one direction (vertically as illustrated in FIG. 1A) but instead extend in both a horizontal and vertical mariner, which can be described as "bending". Throughout this disclosure, use of the term horizontal will refer to the direction of the x-axis and vertical or up/down will refer to the direction of the y-axis in FIGS. 2 and 3. This is best illustrated in FIG. 2C, which shows poly lines 140-2 and 140-2' (when starting at the top of FIG. 2C and moving to the bottom) first extending horizontally left one feature length, and then traveling downwardly to a certain point. Poly lines 140-2, 140-2' then extend in the opposite direction horizontally (i.e., right in FIG. 2D) for two feature lengths, then travel downwardly again a number of feature lengths. Finally, poly lines 140-2, 140-2' travel horizontally left one feature length and then downwardly towards the end of substrate 105, such that each of poly lines 140-2, 140-2' begins and ends in the same corresponding vertical column of substrate 105. Contacts 155-1, 155-2, 155-1' and 155-2' connect poly lines 140-1, 140-2, 140-1' and 140-2', respectively, to the metal two layer 108, as illustrated in FIG. 2A.

Figure 2D:
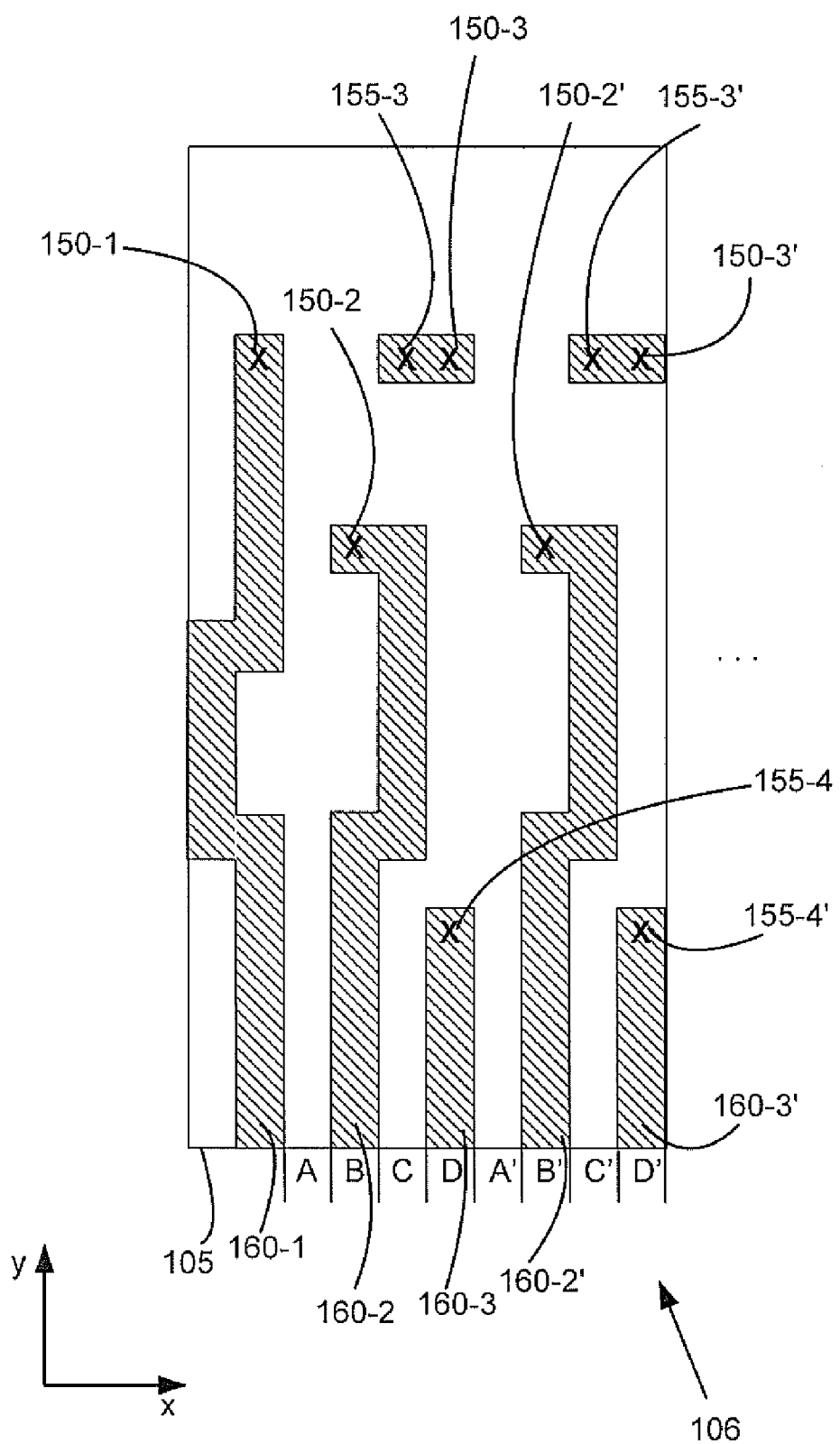
FIG. 2D is a plan view of a metal one layer of the memory array of FIG. 2A.
Figure 2E:
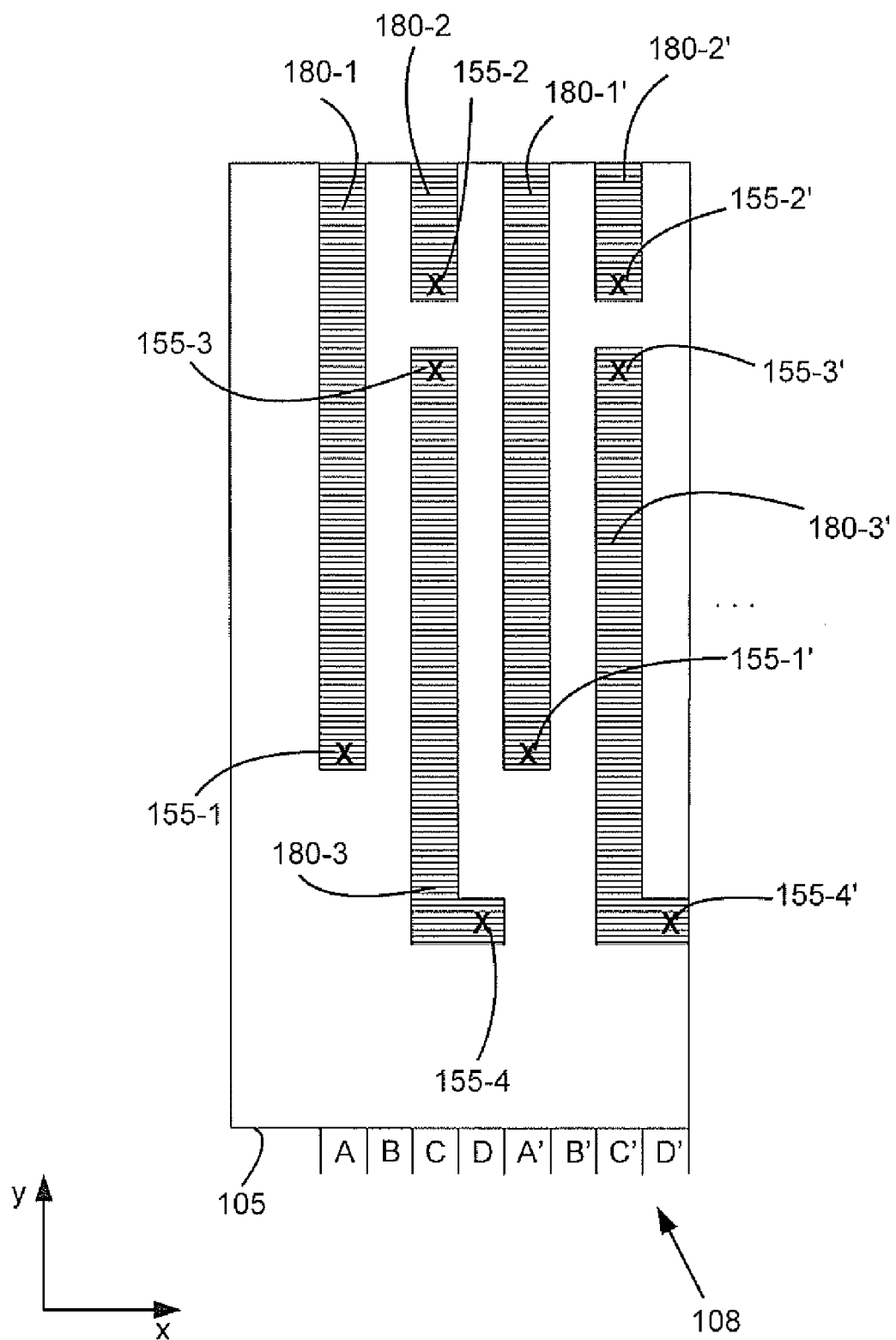
FIG. 2E is a plan view of a metal two layer of the memory array of FIG. 2A.

Poly line 140-1 connects with metal two signal line 180-1 in metal two layer 108 by contact 155-1, which is illustrated in FIGS. 2A, 2C and 2E. This contact 155-1 allows poly line 140-1 to pass a signal to metal two signal line 180-1. Metal two line 180-1 is present in metal two layer 108, which is present over contacts 150-1, 150-2 and 150-3 and metal one layer 106. Thus, metal two layer 108, and metal two signal line 180-1, is separated from both metal one layer 106 and contacts 150. In this manner, the signal present on poly line 140-1, which is connected to metal two line 180-1, may travel in the column immediately proximate contact 150-2, while ensuring that there is no short circuit between poly line 140-1 and contact 150-2. Similarly, poly line 140-2 "bends" around contacts 150-3 and 150-2 such that there is the reduced possibility of short circuit between these contacts and poly line 140-2. As discussed more fully below, the elements present in columns A'-D' comprise repetition of columns A-D and, thus, are arranged as described above.

Referring now to FIG. 2D, metal one layer 106 comprises a plurality of metal one signal lines 160-1 to 160-3 and 160-2' to 160-3'. Similar to that described above in relation to poly layer 104, metal one signal lines 160 change direction or "bend" around contacts 155 to reduce the possibility of short circuit between poly layer 104 and metal one layer 106. For example, metal one signal line 160-1 (when looking at the top of FIG. 2D and traveling towards the bottom) begins at contact 150-1 and travels downwardly until extending horizontally left one feature length to bend around contact 155-1. Metal one signal line 160-1 then travels downwardly, past the vertical position of 155-1, until extending horizontally right to return to the column in which the signal line began.

Metal one signal line 160-2 bends around contact 155-1 and is connected to diffusion layer 102 by contact 150-2. Metal one signal line 160-3, in contrast to metal one signal lines 160-1 and 160-2, utilizes a connection to the metal two layer 108 to avoid a short circuit with contact 155-1', which is present in column A', as described below. Metal two line 180-3 is connected to metal one signal line 160-3 by contact 155-4 at the bottom of FIGS. 2D and 2E and contact 155-3 at the top. Eventually, metal one signal line 160-3 is connected to a diffusion strip at column D through contacts 155-4, 155-3, and 150-3, fulfilling its function as a low-resistance path running parallel with the diffusion path in column D to reduce RC time constant of the path. In this manner, metal one layer 106 avoids the potential of short circuit with contact 155-1'. This pattern may be repeated when traveling horizontally across substrate 105 to complete the memory array, as described below.

Figure 2F:
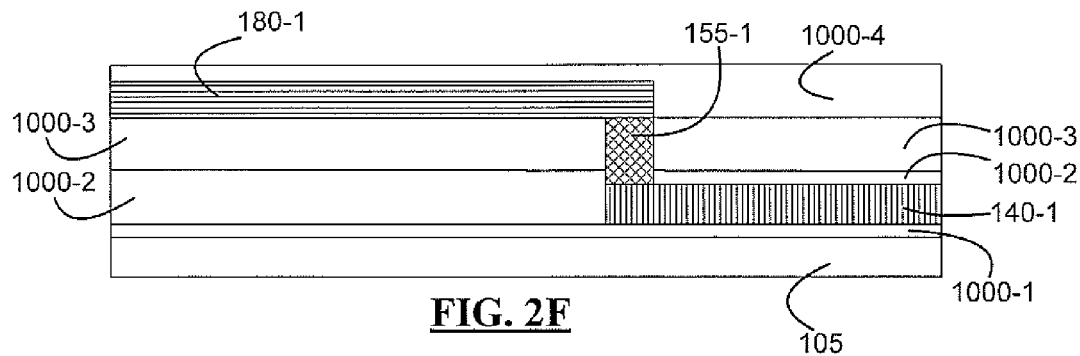
FIG. 2F is a cross-sectional view along the line F-F of the memory array of FIG. 2A.

Referring now to FIGS. 2F-2I, the use of metal two layer 108 to avoid unintentional connections between the various layers of memory array 100 is best described and illustrated in cross-sections of memory array 100. FIG. 2F is a cross-sectional view of the memory array 100 along the line F-F. As shown in FIG. 2F, substrate 105 is first layered with insulating layer 1000-1. Poly signal line 140-1 can be formed out of poly layer 104 using conventional techniques. Insulating layer 1000-2 is layered over poly layer 104 and is utilized to backfill poly layer 104 where the poly signal lines are not present. Metal one layer 106 is then placed over insulating layer 1000-2, etched or otherwise removed in areas where metal one signal lines 160 are not desired, and insulating layer 1000-3 is placed over the other layers and backfilled, as described above. Metal two layer 108 is then layered upon insulating layer 1000-3, and insulating layer 1000-4 is layered upon all previous layers.

Figure 2G:
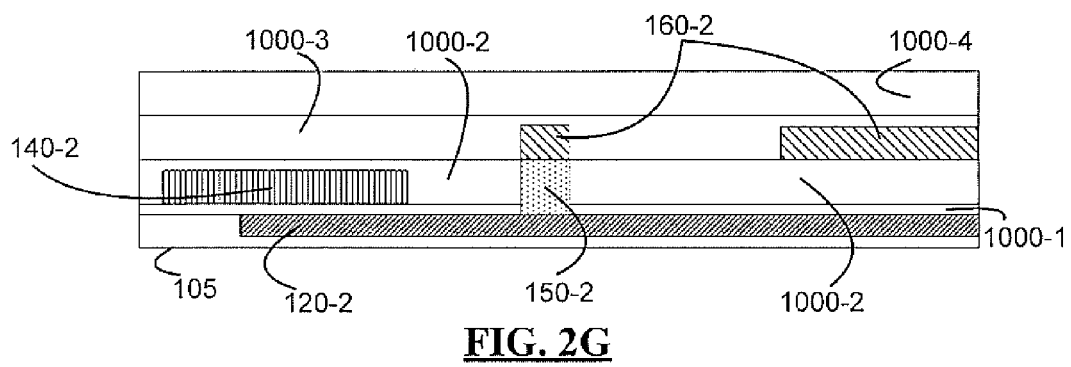
FIG. 2G is a cross-sectional view along the line G-G of the memory array of FIG. 2A.

Referring again to FIG. 2F, poly signal line 140-1 is connected to metal two signal line 180-1 by contact 155-1. In this manner, poly signal line 140-1 can avoid traveling immediately adjacent the column in which contact 150-1 is present, i.e., the column to the left of column A in FIGS. 2A-2E. Referring now to FIG. 2G, a cross-sectional view along the line G-G of the memory array 100 of FIG. 2A is illustrated. Diffusion signal line 120-2 is formed within substrate 105 and covered with insulating layer 1000-1. All other layers are formed as described above. Contact 150-2 is placed between diffusion signal line 120-2 and metal one signal line 160-2. Poly signal line 140-2 is spaced and insulated from contact 150-2 by insulating layer 1000-2. Thus, contact 150-2 is insulated and separated from all lines other than diffusion line 120-2 and metal one line 160-2, which is the intended arrangement for memory array 100.

Figure 2H:
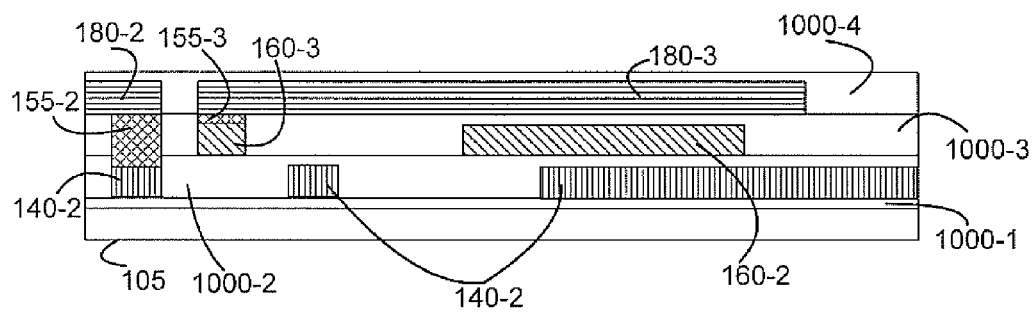
FIG. 2H is a cross-sectional view along the line H-H of the memory array of FIG. 2A.
Figure 2I:
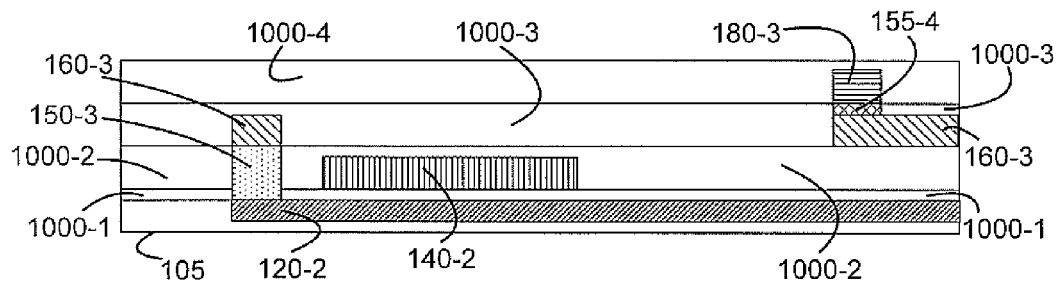
FIG. 2I is a cross-sectional view along the line I-I of the memory array of FIG. 2A.

Referring now to FIG. 2H, insulating layers 1000 physically separate the various layers 102, 104, 106 and 108 from unwanted connections. Furthermore, insulating layer 1000-3 separates contact 155-2 from metal one line 160-3 and allows the direct connection between poly line 140-2 and metal two line 180-2. Similarly, referring now to FIG. 2I, insulating layer 1000-2 physically separates contact 150-3 from poly layer 104, more specifically poly signal line 140-2. Insulating layer 1000-3 also physically separates and insulates contact 155-4 from unwanted connections. As illustrated in the plan view illustrations of FIGS. 2A-2E and the cross-sectional views of FIGS. 2F-2I, by combining the bending of signal lines and the use of metal two layer 108, respectively, as described above, memory array 100 can be manufactured at a minimum feature width, indicated by MF in FIG. 2A, while ensuring that undesirable contacts between the various signal layers 102-108 can be maintained. Thus, efficient use of the surface area of substrate 105 can be made.

Referring again to FIGS. 2A-2I, it is apparent that each of the contacts are separated from signal lines to which they should not be connected by at least one feature length. For example, contact 155-1 is separated from metal one signal line 160-1 by a distance equal to one feature length. Further, contact 155-1 is separated from metal one signal line 160-2 by one feature length. With respect to contact 150-1, poly line 140-1, which is resident in column A immediately next to the column of contact 150-1, is connected to metal two line 180-1 by contact 155-1 in order to remove the possibility of short circuit between poly line 140-1 and contact 150-1. Poly line 140-2 bends to avoid being proximate to contact 150-2 and further bends in the opposite direction to avoid contact connecting with 150-3. The pattern displayed in columns A to D may be repeated when traveling from left to right on substrate 105 in order to make a larger memory array. This repeat pattern is illustrated in columns A' to D' in FIG. 2A, and is not limited to two repeat patterns but can encompass any number of repetitions.

Referring now to FIG. 3, a memory array 200 according to some embodiments of the present invention is illustrated. Memory array 200 comprises a diffusion layer 202, a poly layer 204, a metal one layer 206 and a metal two layer 208. Diffusion layer 202 (see FIG. 3B) comprises a plurality of diffusion lines 220-1 to 220-4 and 220-2' to 220-4', which may be formed by diffusing impurities into substrate 205. A plurality of contacts 250-1 to 250-4 and 250-2' to 250-4' connect the diffusion layer 202 with metal one layer 206 and metal two layer 208, as described below.

Figure 3A:
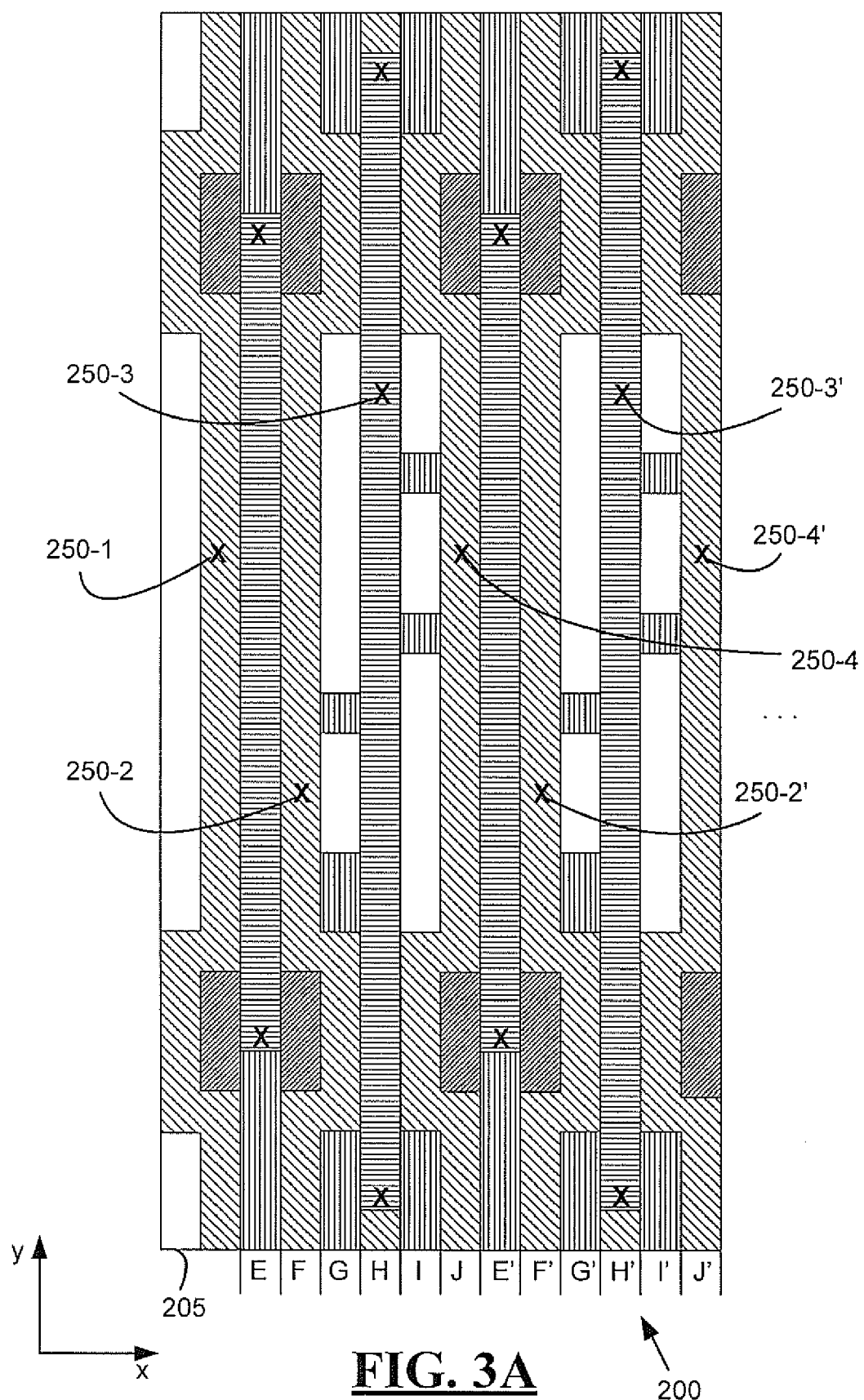
FIG. 3A is a plan view of a memory array according to some embodiments of the present disclosure.
Figure 3B:
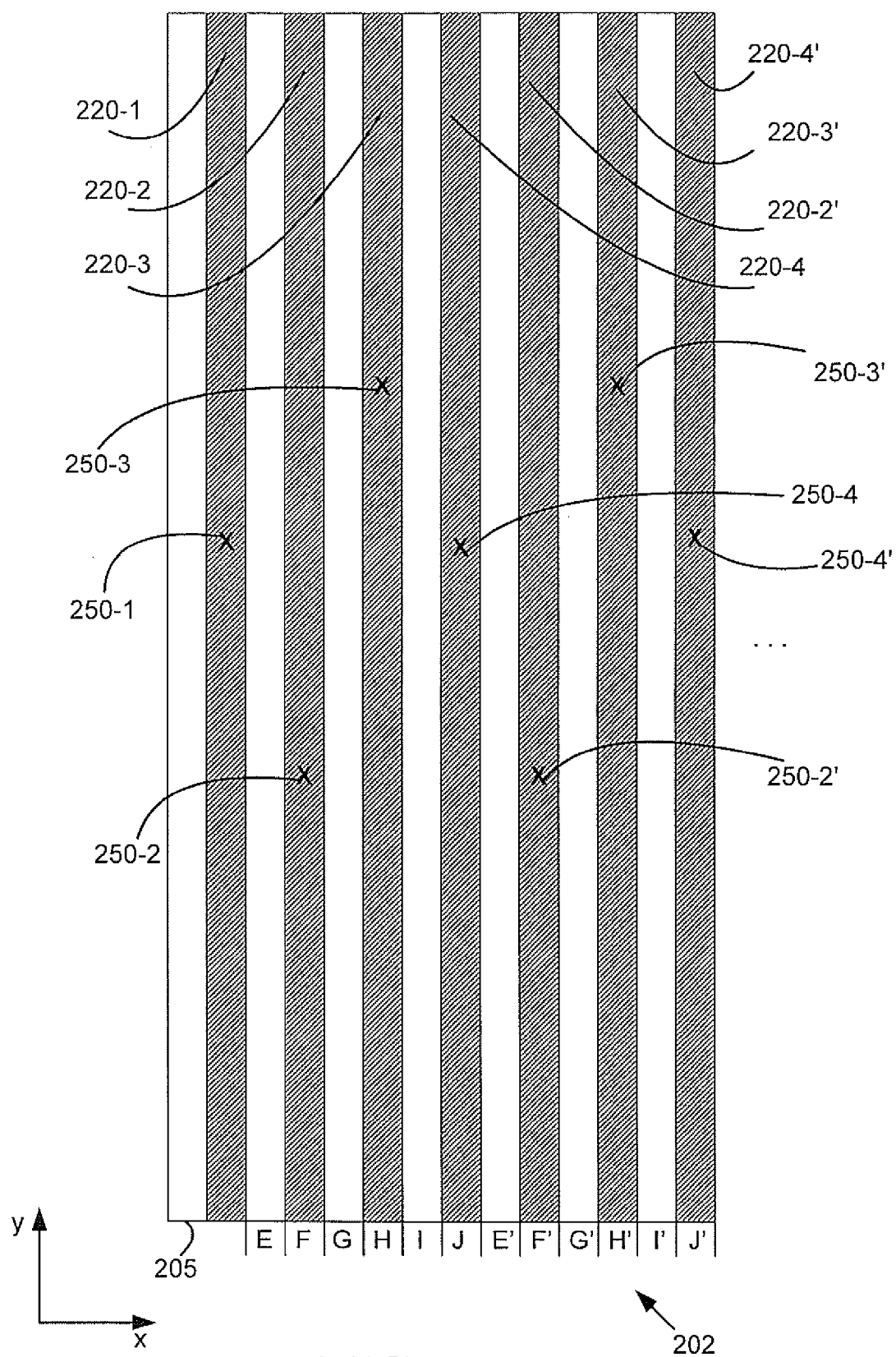
FIG. 3B is a plan view of a diffusion layer of the memory array of FIG. 3A.
Figure 3C:
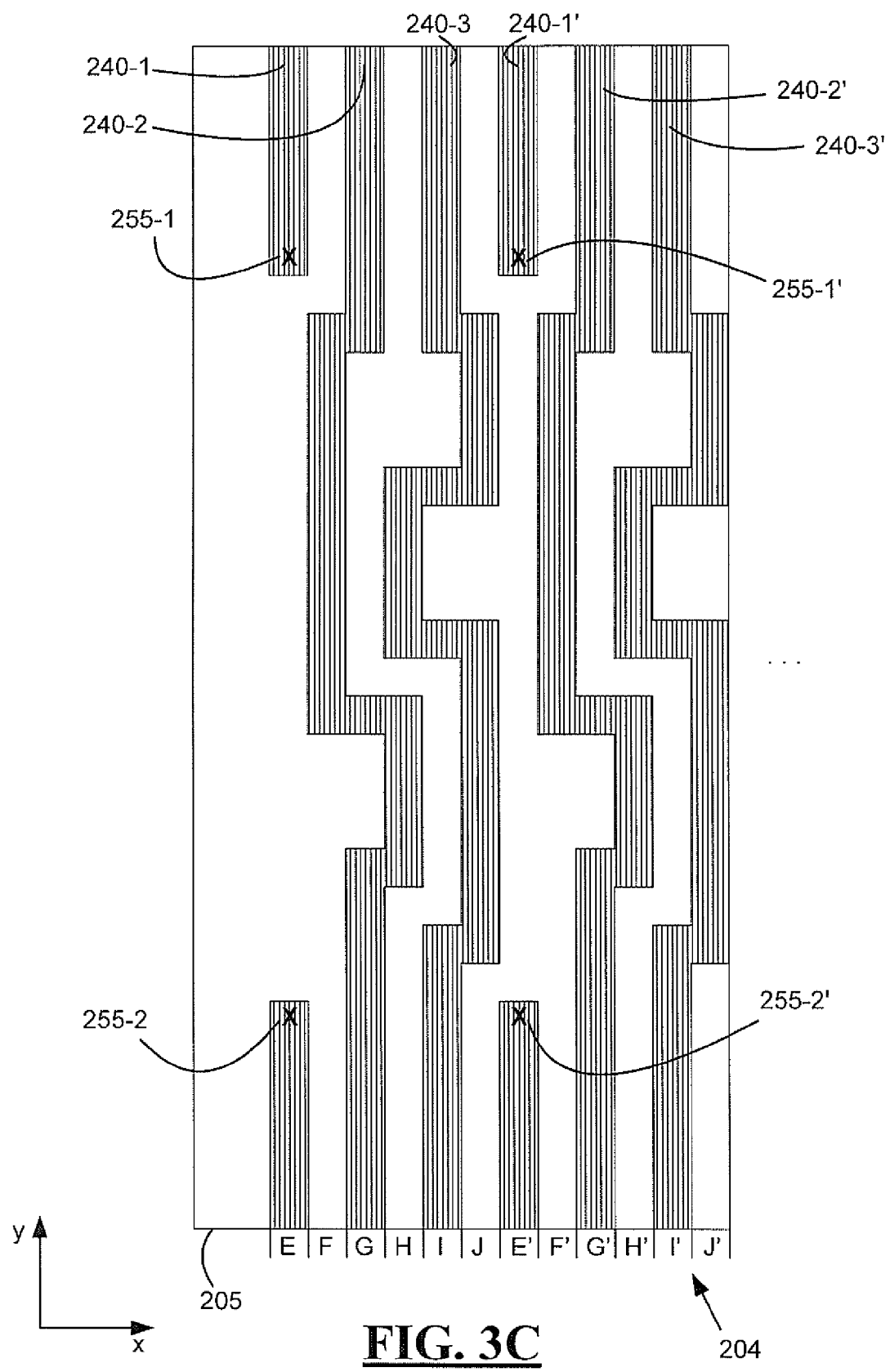
FIG. 3C is a plan view of a poly layer of the memory array of FIG. 3A.

Referring now to FIG. 3C, poly layer 204 comprises a plurality of poly signal lines 240-1 to 240-3 and 240-1' to 240-3'. A plurality of contacts 255-1 and 255-2 connect signal line 240-1 to metal two layer 208, as described below. Furthermore, contacts 255-1' and 255-2' connect poly line 240-1' to metal two layer 208, as the pattern of columns E through J are repeated in columns E' through J', similar to memory array 100 described above.

Figure 3D:
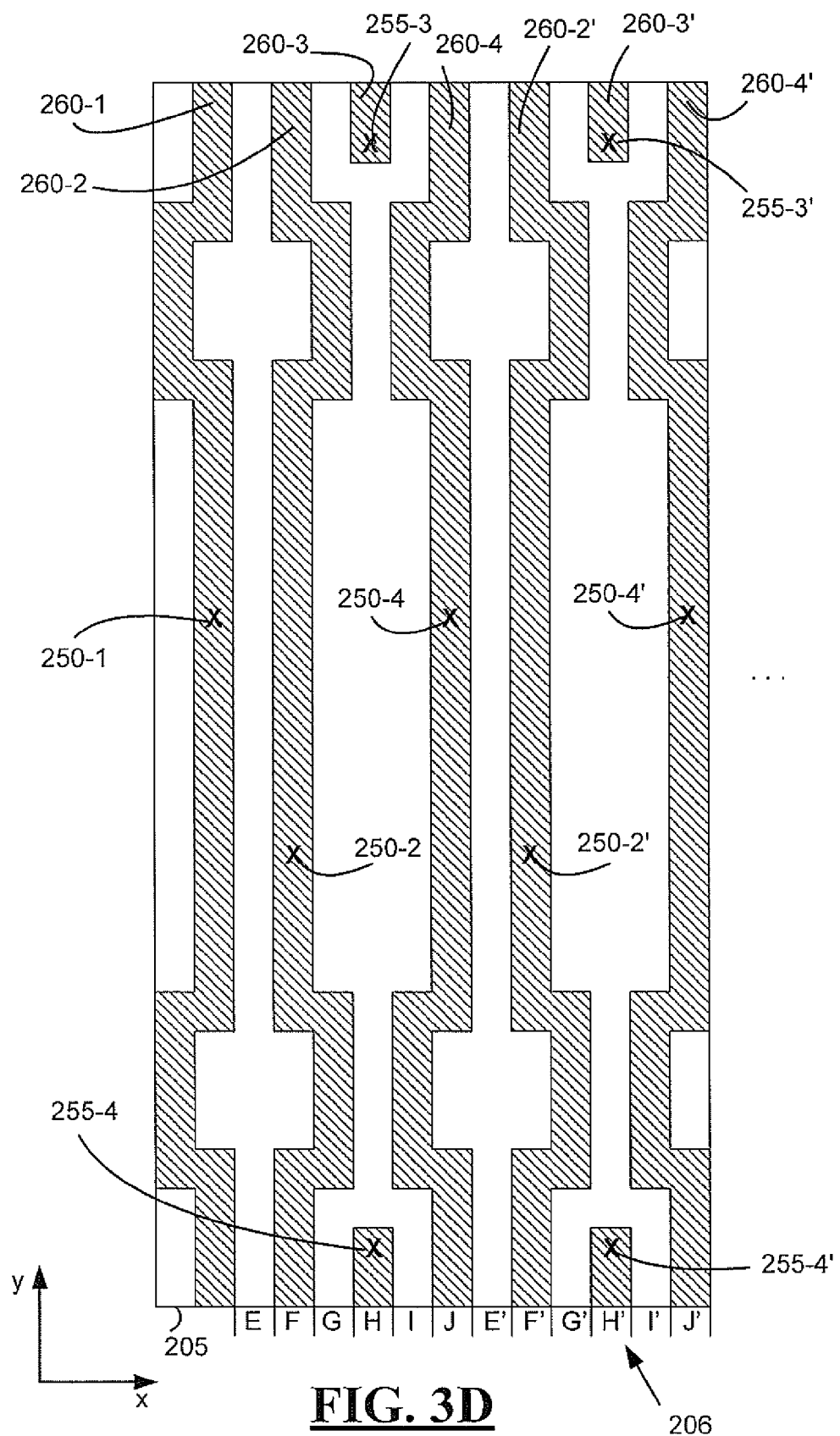
FIG. 3D is a plan view of a metal one layer of the memory array of FIG. 3A.

Referring now to FIG. 3D, metal one layer 206 comprises a plurality of metal one signal lines 260-1 through 260-4 and 260-2' through 260-4'. Contacts 2501 to 250-3 and 250-2' to 250-3' connect metal one layer 206 to diffusion layer 202. As shown in FIG. 3D, metal one signal lines 260-1, 260-2, 260-4, 260-2' and 260-4' bend in a horizontal direction as illustrated to avoid a possible short circuit with the contacts 255-1, 255-2, 255-1' and 255-2'. Metal one signal lines 260-3 and 260-3' connect to metal two layer 208 through contacts 255-3 and 255-4 and 255-3' and 255-4', respectively. Metal two layer 208 is connected to diffusion layer 202 by contacts 250-3 and 250-3', as illustrated in FIGS. 3A and 3E.

Figure 3E:
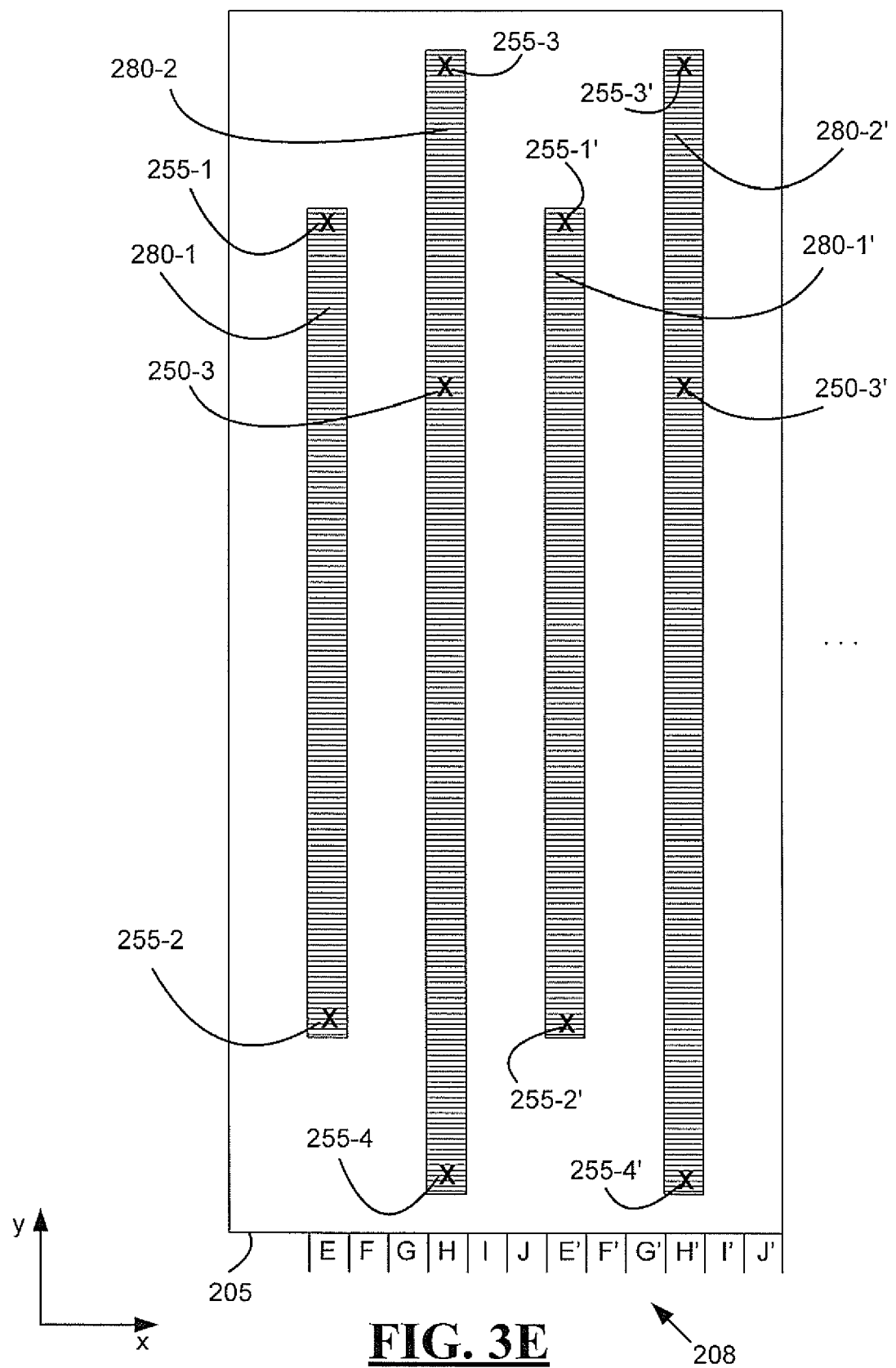
FIG. 3E is a plan view of a metal two layer of the memory array of FIG. 3A.

Referring now to FIG. 3E, metal two layer 208 comprises metal two signal lines 280-1, 280-2, 280-1' and 280-2'. Metal two signal line 280-1 connects with poly line 240-1 through contacts 255-1 and 255-2. Metal two signal line 280-2 connects to metal one signal line 260-3 by contacts 255-3 and 255-4, as described above. Similarly, metal two layers 280-1' and 280-2' connect with poly layer 204 and metal one layer 206, respectively.

Through the use of bending in the signal lines and connection to metal two layer 208, similar to that described in FIGS. 2A-2I above, a minimum distance is maintained between contacts and signal lines that may be unintentional connected thereto. Thus, the width of the columns of the signal lines may comprise a minimum feature size due to this avoidance of potential short circuits. In this manner, the surface area of substrate 205 may be utilized more efficiently. Furthermore, and similarly to the memory array 100 described in FIG. 2 above, the layout pattern set forth in columns E through J may be repeated across the surface of substrate 205. An exemplary pattern repetition is illustrated in FIG. 3 in columns E' to J', which correspond to columns E to J, respectively. Furthermore, memory array 200 is organized such that each of the poly 240 and metal one signal lines 260 are in the same vertical column at the top and bottom of memory array 200.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A memory array, comprising:
    a diffusion layer comprising a plurality of diffusion lines, wherein the plurality of diffusion lines extend in a first direction;
    a poly layer comprising a plurality of poly lines, wherein the plurality of poly lines extend in the first direction and are arranged on top of and insulated from the diffusion layer;
    a metal one layer comprising a plurality of metal one lines, wherein the plurality of metal one lines i) extend in the first direction, and ii) are arranged on top of and insulated from the poly layer;
  a metal two layer comprising at least one metal two line, wherein the at least one metal two line i) extends in the first direction, and ii) is arranged on top of and insulated from the metal one layer; and
    a contact that extends through the poly layer, wherein the contact connects at least one of the plurality of metal one lines to at least one of the plurality of diffusion lines,
    wherein the at least one metal two line is connected to at least one of the plurality of poly lines, and wherein at least one of the plurality of poly lines further extends in a second direction to bend around the contact such that at least a predetermined distance separates the plurality of poly lines from the contact.

2. The memory array of claim 1, wherein the predetermined distance comprises a minimum feature size.

3. The memory array of claim 1, wherein the second direction is substantially perpendicular to the first direction.

4. A method for manufacturing an integrated circuit, the method comprising:
    forming a first signal line layer comprising a plurality of first signal lines, wherein the plurality of first signal lines extend in a first direction;
    forming a second signal line layer comprising a plurality of second signal lines, wherein the plurality of second signal lines i) extend in the first direction, and ii) are arranged on top of and insulated from the first signal line layer;
    forming a third signal line layer comprising a plurality of third signal lines, wherein the plurality of third signal lines i) extend in the first direction, and ii) are arranged on top of and insulated from the second signal line layer; and
    connecting at least one of the plurality of third signal lines to at least one of the plurality of first signal lines with a contact that extends through the second signal line layer,
    wherein at least one of the plurality of second signal lines further extends in a second direction to bend around the contact such that at least a predetermined distance separates the plurality of second signal lines from the contact.

5. The method of claim 4, wherein the predetermined distance comprises a minimum feature size of the integrated circuit.

6. The method of claim 4, further comprising:
    forming a fourth signal line layer comprising at least one fourth signal line,
    wherein the at least one fourth signal line i) extends in the first direction, and ii) is arranged on top of and insulated from the third signal line layer, and
    wherein the at least one fourth signal line is connected to at least one of the plurality of second signal lines.

7. The method of claim 4, wherein:
    the plurality of first signal lines comprises diffusion lines;
    the plurality of second signal lines comprises poly lines; and
    the plurality of third signal lines comprises metal lines.

8. The method of claim 6, wherein the second direction is substantially perpendicular to the first direction.

9. The method of claim 8, wherein the integrated circuit comprises a memory array.

10. The method of claim 9, wherein the predetermined distance comprises a minimum feature size.

* * * * *